United States Patent
Chiang et al.

(10) Patent No.: US 6,309,956 B1
(45) Date of Patent: *Oct. 30, 2001

(54) FABRICATING LOW K DIELECTRIC INTERCONNECT SYSTEMS BY USING DUMMY STRUCTURES TO ENHANCE PROCESS

(75) Inventors: Chien Chiang, Fremont; David B. Fraser, Danville; Anne S. Mack, Saratoga; Jin Lee, Mountain View, all of CA (US); Sing-Mo Tzeng, Hsuinchu (TW); Chuanbin Pan, San Jose, CA (US); Vicky Ochoa, Pleasanton, CA (US); Thomas Marieb, San Francisco, CA (US); Sychyi Fang, Palo Alto, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/370,968

(22) Filed: Aug. 10, 1999

Related U.S. Application Data

(62) Division of application No. 08/938,492, filed on Sep. 30, 1997.

(51) Int. Cl.[7] ..................................................... H01L 21/28
(52) U.S. Cl. ........................ 438/622; 438/624; 438/633; 438/667; 438/926
(58) Field of Search .................................... 438/622, 623, 438/624, 631, 632, 633, 640, 669, 687, 667, 627, 926; 257/776, 750, 752, 758, 528

(56) References Cited

U.S. PATENT DOCUMENTS

| | | |
|---|---|---|
| 4,902,646 | 2/1990 | Nakano . |
| 5,281,555 | 1/1994 | Cho . |
| 5,675,187 | 10/1997 | Numata et al. . |
| 5,686,338 | 11/1997 | Liu . |
| 5,744,865 | 4/1998 | Jeng et al. . |
| 5,786,633 | 7/1998 | Wolfgang et al. . |
| 5,798,289 * | 8/1998 | Yang et al. ............................ 438/622 |
| 5,798,298 | 8/1998 | Yang et al. . |
| 5,811,352 * | 9/1998 | Numata et al. ....................... 438/622 |
| 5,817,568 | 10/1998 | Chao . |
| 5,821,621 | 10/1998 | Jeng . |
| 5,882,983 | 3/1999 | Gardener et al. . |
| 5,915,203 * | 6/1999 | Sengupta et al. ..................... 438/669 |
| 5,929,528 * | 7/1999 | Kinugawa ............................. 257/776 |

FOREIGN PATENT DOCUMENTS

| | | |
|---|---|---|
| 002 251 722 | 7/1992 | (GB) . |
| 405 267 479 | 10/1993 | (JP) . |
| 406 151 767 | 5/1994 | (JP) . |

* cited by examiner

Primary Examiner—Matthew Smith
Assistant Examiner—Igwe U. Anya
(74) Attorney, Agent, or Firm—Blakely, Sokoloff, Taylor & Zafman LLP

(57) ABSTRACT

The present invention relates to semiconductor devices. More specifically, the invention discloses the use of dummy structures to improve thermal conductivity, reduce dishing and strengthen layers formed with low dielectric constant materials.

6 Claims, 2 Drawing Sheets

FABRICATING LOW K DIELECTRIC INTERCONNECT SYSTEMS BY USING DUMMY STRUCTURES TO ENHANCE PROCESS

This application is a division of application Ser. No. 08/938,492, filed on Sep. 30, 1997, and now pending.

BACKGROUND OF THE INVENTION

1. Field of the Invention

The invention relates to the field of semiconductor processing. More specifically, this invention relates to an apparatus and method for avoiding dishing, improving the heat transfer characteristics, and structurally strengthening a multilayer dielectric structure with a low dielectric constant material layer.

2. Description of Related Art

A semiconductor integrated circuit is built by layering electrically conductive materials patterned in electrical circuitry over a semiconductor substrate. The electrically conductive materials are in separate planes, with electrical interconnects connecting the various layers of conductive materials. Insulating material is held between the planes of electrically conductive material and around the interconnects. Typically, the same insulating material is also used within the trenches of the electrically conductive material layers. The traditionally used insulating material is a silicon dioxide, having a dielectric constant (k) of approximately four. Silicon dioxide is a useful insulating material because it is thermally stable, and mechanically strong. A second advantage of using silicon dioxide is that the process techniques are well developed. One of those process techniques is the time needed to etch a layer in order to maintain planarization. However, better device performance may be achieved by replacing the silicon dioxide with a lower dielectric constant ("low k") material using a low k material between conducting layers reduces the capacitance of the structure by reducing the resistance-capacitance time constant. Thus reducing device capacitance increases device speed. Organic polymer with its lower dielectric constant is one potential replacement of silicon dioxide.

However, it has been found that using low k dielectric materials such as organic polymer as the insulating material in a semiconductor device is problematic. Silicon dioxide, the insulating material used in the prior art, is about 50 times harder than organic polymer. The elastic modulus of silicon dioxide is about 20 times greater than organic polymer. Thus organic polymer is mechanically weak compared with silicon dioxide. Thus organic polymer interlayers may not be strong enough to support adjacent materials. Furthermore the interlayers are under large thermal strain due to a significant thermal expansion mismatch between the silicon substrate and the organic polymer. The mismatch is typically twenty-five times larger than the mismatch between silicon and silicon dioxide. This thermal strain can cause reliability problems such as cracking or delamination in the structures adjacent to the organic polymer.

A second problem with using organic polymer as an insulating material is that organic polymer has a significantly lower thermal conductivity than silicon dioxide (3–30 times lower). Thus organic polymer dissipates heat poorly. Poor heat dissipation leads to heat build-up and to poor reliability in semiconductor integrated circuits.

A third problem results from the occasional use of spin-on techniques to deposit organic polymer interlayers instead of more traditional chemical vapor deposition (CVD) techniques. The planarity of a spin-on film strongly depends on the underlying feature size of the substrate. A fourth problem in the processing of semiconductor layers is dishing of the insulating material in open areas between structures. Thus a method or apparatus is needed to strengthen semiconductor interlayers, improve mechanical reliability, improve the heat dissipation characteristics, and minimize dishing between interconnects of semi-conductor devices using organic polymers as an insulating agent.

SUMMARY OF THE INVENTION

In one embodiment, the present invention is a semiconductor structure used to improve heat dissipation between interconnects. The apparatus utilizes a dummy structure adjacent a low dielectric constant material.

BRIEF DESCRIPTION OF THE DRAWINGS

The advantages of the present invention will become more readily apparent to those ordinarily skilled in the art after reviewing the following detailed description and accompanying drawings, wherein.

DETAILED DESCRIPTION OF THE INVENTION

In the following discussion, certain conventions and definitions will be used to simplify the description and facilitate understanding of the invention. For example, particular geometric shapes and structures will be used in the illustrations. These details are used for illustrative purposes and unless specifically claimed are not to be considered restrictive of the broad inventions.

In the invention, dummy structures are used to strengthen semiconductor interlayers, improve mechanical reliability, improve the heat dissipation characteristics and minimize dishing between interconnects of semiconductor devices using organic polymer as an insulating agent. Dummy structures are elements that are not part of the active circuitry, thus they have no function in the active circuitry. The purpose of the dummy structure is to provide the benefits previously described. Thus, as implemented dummy structure are usually electrically isolated. In alternate embodiments, the dummy structures may be connected to ground.

Figure 1:
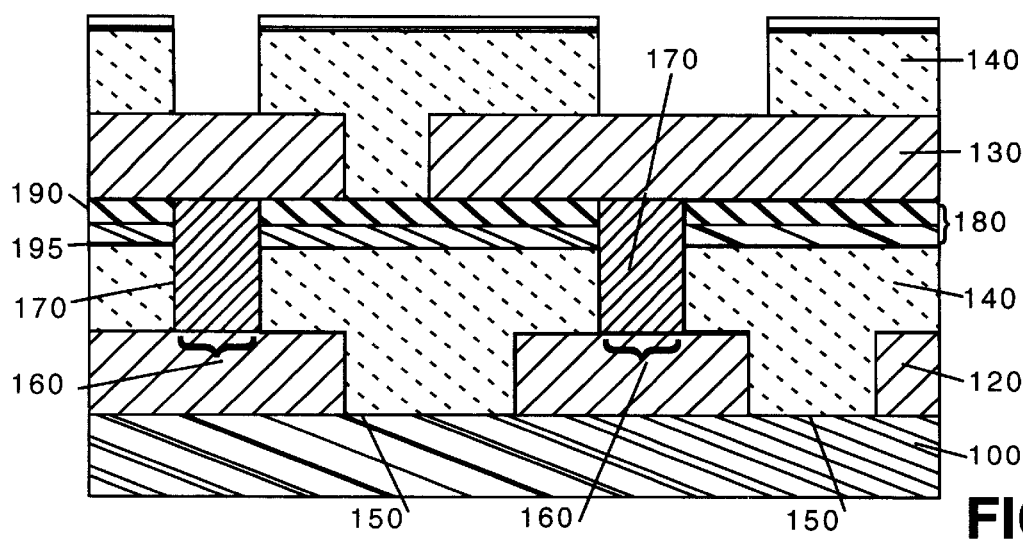
FIG. 1 illustrates a cross sectional view of an interconnect structure using an organic polymer as an insulating material.

FIG. 1 illustrates an interconnect structure made on a substrate 100 using organic polymer as the insulating material. An insulating material layer, in this example an organic polymer dielectric 140 is fabricated between a first layer of patterned metal 120 and a second layer of patterned metal 130. The organic polymer dielectric 140 also fills trenches or open areas 150 within the first layer of patterned metal 120. To electrically connect the metal layers 120 and 130, vias 160 are created in the organic polymer dielectric 140. Vias 160 are typically filled with an electrically conductive plug such as tungsten, aluminum or copper. Plug forms an electrical interconnect 170 between the first patterned metal layer 120 and the adjacent second patterned metal layer 130. A hard mask 180 made of silicon dioxide 195 and silicon nitride 190, serves as a protective top coating for organic polymer dielectric 140. The structure can be built further upward in a repeated structural sequence.

While a low dielectric constant material for insulating is desirable for reducing capacitance, one shortcoming of low dielectric constant material is that typically, low k material is mechanically weaker than silicon dioxide. Low dielectric constant material also typically has a very different thermal expansion coefficient than that of the surrounding material. The combination of mechanical weakness and different expansion coefficients causes stress that increases the number of related failure problems. For example, the thermal strain in the low dielectric constant interlayer adjacent to the hardmask 180, where the organic polymer dielectric 140 serves as the primary support material, can induce considerable bending stress at the interface between the hardmask 180 and vias 160. The stress may cause cracking leading to failure of the device. The problems which result from the mismatch between thermal expansion coefficients is exacerbated as the distance between the trenches or open areas 150 between vias 160 become wider.

A second problem with organic polymer 140 is the polymer's poor heat dissipation compared with the silicon dioxide material formerly used. Thus, heat generated in the device structure during operation is more difficult to remove leading to inferior device performance. A third problem with organic polymers is due to uneven planarization when spin on deposition is used. Dishing of the organic polymer is another problem which must be minimized.

Figure 2:
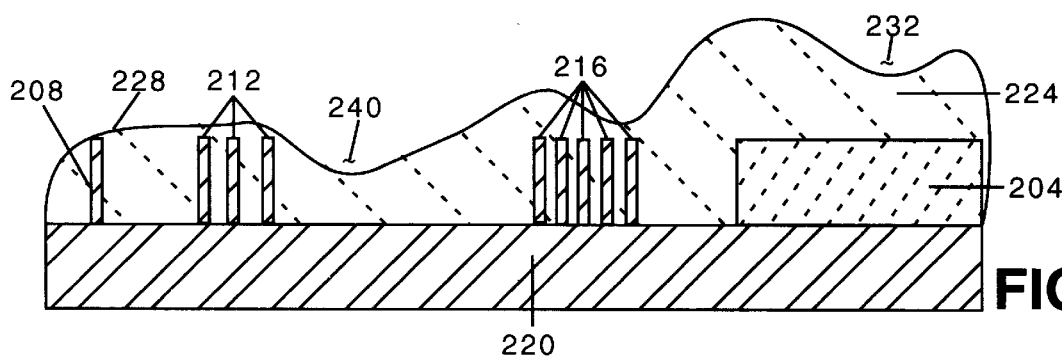
FIG. 2 illustrates a cross sectional view illustrating the distribution of low dielectric material over different configurations of metal structures.

FIG. 2 illustrates a cross section of low k dielectric material distribution across different configurations of metal structures. As can be seen from FIG. 2, the low k material coating varies in thickness and suffers from uniformity and planarity problems. As illustrated, the coating of the low k material is heavily pattern dependent and the planarity across the die is poor. In FIG. 2, metal groups 204, 208, 212 and 216 are deposited on top of a substrate 220. The metal is arranged such that wide metal pads 204, a singular metal line 208 and groups of metal lines 212, 216 are superimposed on top of substrate 220. A low k dielectric material 224 is deposited across the entire surface. During chemical mechanical planarization (CMP), the material is etched away unevenly. In a region 228, above the singular metal line 208, the low k dielectric 224 is etched away such that very little low k dielectric material 224 remains. The CMP leaves significant low k material above densely packed groups of metal lines 216 and above the wide metal pad 204; however, significant dishing 232 may occur in the trench area between the wide metal pad 204 and groups of metal lines 216.

In order to generate a planar surface, the chemical planarization of low k material 224 targets the removal of the protrusions. This process results in over polishing for isolated lines 208. The polishing requirements will also increase dishing of the low k material in open areas. This causes planarity issues for subsequent layers deposited on top. By inserting a dummy structure in the open areas, the planarity of the structure can be improved. In particular, the dishing 232, 240 between groups of metal structures 204, 216, 212 may be avoided by using dummy structures (not shown in FIG. 2).

Figure 3A:
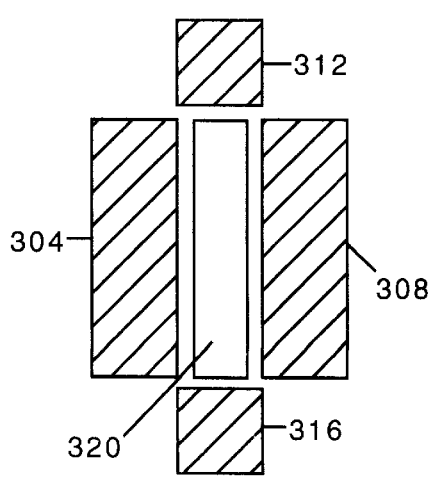
FIGS. 3A and 3B illustrate a top view of two possible dummy structure configurations.
Figure 3B:
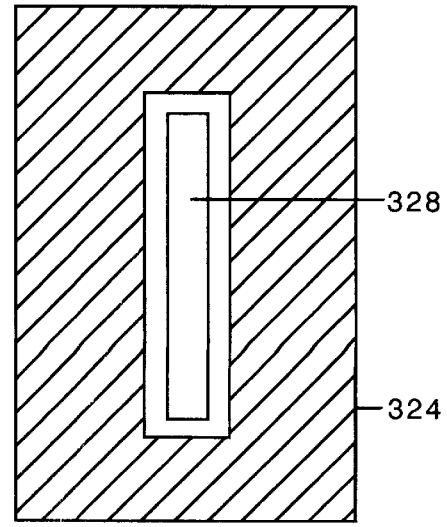

FIG. 3a and 3b illustrate a top view of possible dummy structures. As previously discussed, dummy structures are not part of the circuitry. Thus, they have no function in the active circuit. In FIG. 3a, dummy structures 304, 308, 312, 316 surround an interconnect structure 320. The dummy structures 304, 308, 312, 316 may be made from dummy metal. In order to simplify fabrication, the dummy structure is preferably made from the same material as the interconnect structure. The dummy structure protects sides of the structure that are adjacent to the interconnect structure. The dummy structures fill up nearby open fields. In one embodiment of the invention, the size of the dummy structures is made as large as possible. In other embodiments, multiple dummy structures may be used and the density of dummy structures may be adjusted to match the density of other circuit features. In one embodiment, the spacing between the dummy structure and the protected device is kept as small as possible. The actual spacing is limited by device technology. Thus, the ideal spacing may get smaller as process technology improves. The small spacing minimizes dishing between the dummy structure and the protected device. The large size of the dummy structure maximizes heat conduction through the dummy structures and strengthens the entire device.

The dummy structures may be arranged in a variety of configurations. In FIG. 3a, the illustrated dummy structures 304, 308, 312, 316 are positioned parallel to the side of the circuit feature such as a metal interconnect 320. In an alternate embodiment shown in FIG. 3b, the dummy structure 324 completely surrounds the metal interconnect 328. It is noted that the dummy structures themselves 304, 308, 312, 316 and 324 may be made up of either one large structure or a plurality of closely spaced smaller structures such as a dense grouping of fine lines.

Figure 4:
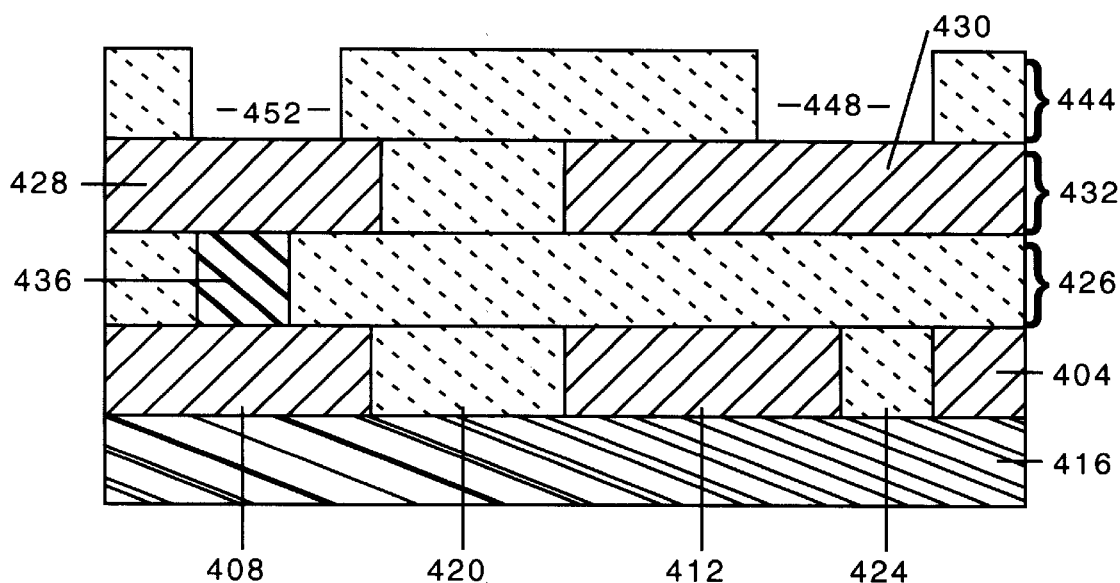
FIG. 4 illustrates a cross sectional view of one embodiment of using dummy structures between metal interconnects.

FIG. 4 illustrates a cross sectional view of one embodiment of the present invention. The novel structure lines metal lines 404, 408, and a dummy structure 412 residing on top of a substrate 416. Although in the illustrated embodiment, the dummy structure is illustrated in a layer with the metal lines, it is recognized that the dummy structure may also be formed in or extended into adjacent layer 428. In one embodiment, the substrate 416 is composed of silicon oxide. In an alternate embodiment, the substrate may be phosphorous doped silicon dioxide. The metal lines 404, 408 may be aluminum, tungsten, or another conductive material, preferably a metal. Trenches 420, 424 are etched between metal lines 404, 408 and the dummy structure 412. The trenches 424 and 420 are filled with a low k dielectric material.

The low k dielectric material continues above the metal lines 404, 408 and dummy structure 412 to form a layer 426 separating a second layer 432 of metal lines 428, 430 from the lower level of metal lines 404, 408 and dummy structure 412. The low k dielectric layer 428 includes vias 436 which are filled with metal plugs to form interconnects between a metal line 428 in layer 432 and metal lines 408 beneath. It should be noted that in one embodiment dummy structure 412 is not electrically connected to any other conductor and in the illustrated embodiment is surrounded on all sides except the bottom by the low k dielectric material typically organic polymer. Thus, the dummy structure as illustrated is electrically isolated. In an alternate embodiment, the dummy structures may be connected to ground.

In the embodiment shown, the bottom of the dummy structure is adjacent to the silicon oxide substrate 416 although a dummy structure may also be incorporated into layer 432. A dummy structure in layer 432 would be completely encased on all sides by low k dielectric material. The low k dielectric material also fills in the spaces between the metal lines 428, 430 in level 432 and forms a second insulating layer 444 above the metal lines of layer 432. The layer 444 also has vias 448, 452 cut to form further lines to subsequent layers.

Figure 5:
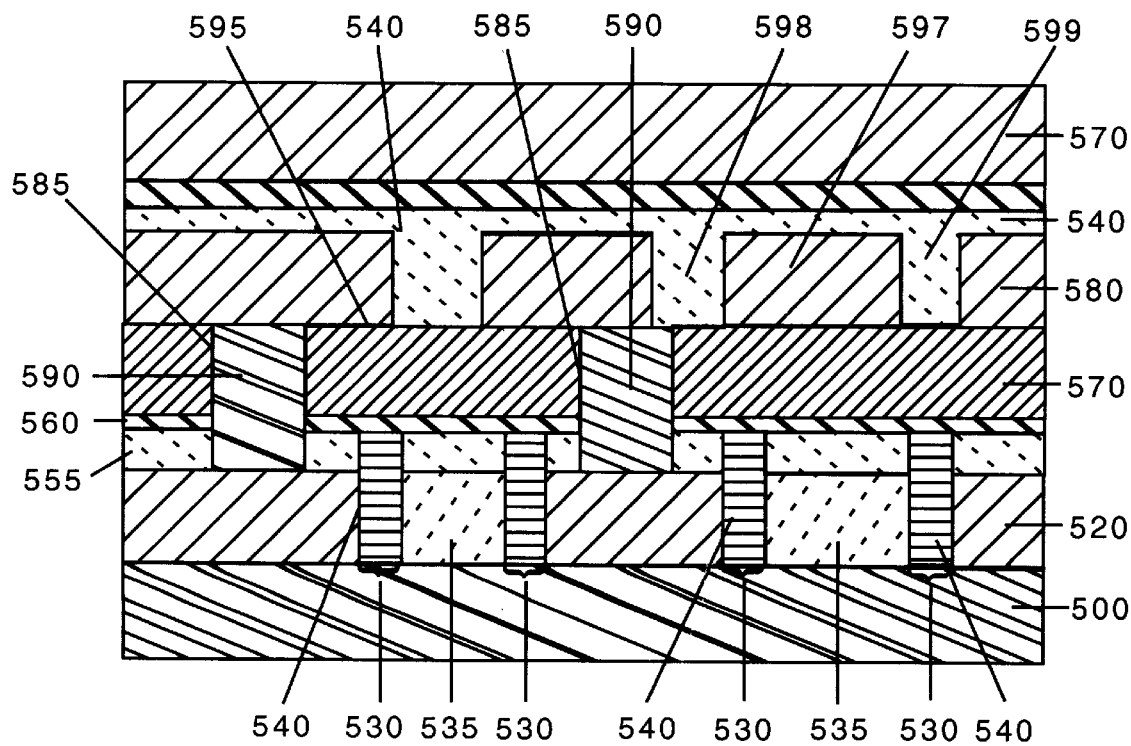
FIG. 5 illustrates a cross sectional view of a second embodiment using dummy structures between metal interconnects.

FIG. 5 illustrates a second cross-sectional view of a second embodiment of the structure of the present invention. The structure of the present invention may be used in any portion of a semiconductor integrated circuit where there is at least one layer of patterned electrically conductive material having insulating material held within the trenches of the pattern. Although the preferred embodiment of the invention is directed towards interconnects, the dummy structures may be implemented in other electrically conductive material. FIG. 5 illustrates a first metalization and a second metalization in a typical semiconductor integrated circuit.

In accordance with one embodiment of the present invention, a patterned first metal 520, preferably aluminum or aluminum alloy is deposited over a substrate 500. The thickness of the patterned first metal layer 520 varies based on the integrated circuit being fabricated and is generally about 0.5 to 2 microns. A patterned metal layer 520 contains isolation spaces including trenches 530 and dummy structures 535. The trenches 530 are substantially filled with a first insulating material 540. In this invention "substantially filled" means the trenches are filled with first insulation material 540 at least to a level such that the dielectric constant of first insulation material 540 will have a predominant effect on the capacitance within trenches 530. In one embodiment insulating material 540 may also be a composite material. Also for purposes of this invention, the term "trench"is to be construed broadly, and is not to be limited to an opening having parallel straight edges; rather, "trench" can refer to an interstitial spacing within the pattern being substantially filled with first insulating material 540.

The placement of dummy structures 535 and trenches 530 as well as the dimensions are determined based on the circuit pattern for the given metal layer and the design rules for the integrated circuit device being fabricated. Preferably the width of trenches 530 are minimized and kept to about 0.1 to 100 microns, although this may be further reduced as process technology improves. Trench insulating material 540 is a low k material having a relatively low dielectric constant that can withstand the temperatures of subsequent processing steps. A low dielectric material preferably has a dielectric constant lower than that of silicon dioxide, to reduce the capacitance between the metal lines in the patterned first metal layer 520. Preferably the low K dielectric constant of insulating material 540 is kept below four. An example of such a material is a high temperature organic polymer such as polyarylether. Other examples of such materials are silicon oxide glass, fluorinated silicon dioxide, hexagonal boron nitride, silicon carbide, foamed polymer, porous silicon dioxide, or aerogels. An aerogel is typically porous silicon dioxide. For convenience of description, low k insulating material which includes all the previous material has been referred to through much of this application as an organic polymer.

A preferred method of forming the illustrated structures includes placing a thin insulating material mask 555 directly on first metal layer 520 and dummy structures 535 in a thickness of about 300 to 1000 angstroms prior to deposition of organic polymer 540. Insulating material mask 555 serves as a stopping layer during the planarization of organic polymer 540. In the illustrated embodiment, the material used in interlayer insulating or dielectric material 570 may also be also used as insulating material mask 555. The organic polymer 540 fills the trenches 530 such that the top surface of the organic polymer matches the top surface of insulating material mask 555.

The top of organic polymer 540 preferably includes a protective coating 560 made of an insulating material that is mechanically strong. Protective coating 560 protects organic polymer 540 against potential harm from chemical reactions that occur during subsequent processing. The preferred material for protective coating 560 is silicon nitride, although silicon carbide can also be used. Protective coating 560 is thick enough to protect organic polymer 540 but thin enough that it will not otherwise affect the capacitance of interlayer dielectric 570. In general, protective coating 560 is preferably around 300 angstroms or less in thickness.

The material used as trench insulating material 540 and the fabrication process steps that may chemically attack trench insulating material 540 determine the material and thickness of protective coating 560. In some cases protective coating 560 is unnecessary. More specifically by way of example, if the subsequent process fabrication steps do not involve a chemically attacking agent such as oxygen, or if trench insulating material 540 is not otherwise prone to attack by oxygen, then protective coating 560 is not needed. If a strong coating is used, and dishing is not a problem, dummy structures 535 serve the primary function of improving heat dissipation and strengthening the structure.

Different layers may use different insulation material, for example, a different insulating material from trench insulating material 540 may be used in layer 570. In the embodiment where a different material is used, the interlayer insulating material in layer 570 is selected to be one that has a higher thermal conductivity and stronger mechanical strength than trench insulating material 540. Such a material will generally have a higher dielectric constant than trench insulating material 540. Preferably interlayer insulating material in layer 570 is silicon dioxide, and for descriptive purposes may be referred to here as silicon dioxide. The thickness of interlayer insulating material dioxide 570 varies to meet design criteria for each integrated circuit, but typically the silicon dioxide has a planar top surface and a thickness of approximately 1 to 2 microns.

Further in accordance with an embodiment of the present invention, the structure can be built upward by forming a second metal layer and electrically connecting the two metal layers. In one embodiment of the present invention, the structure in layers 520, 555, 560 and 570 may be repeated in an upward configuration. In an alternate embodiment as shown, a second electrically conductive layer 580, for example, an aluminum metal or alloy, is formed on interlayer insulating material 570. Interlayer insulating material 570 contains via openings 585 for forming a pathway between the metal planes. This pathway is usually for providing electrical connections between the metal layers, but is also useful for providing a thermal pathway. Vias 585 generally have a diameter of about 0.2 to 1 micron, depending on the widths of the metal lines directly above and below. The vias 585 are usually filled with an electrically conductive material to provide a plug 590. Plug 590 may be made of tungsten, aluminum, aluminum alloy, copper, or other electrically conductive material. Although not shown, the plug 590 may also be a portion of second metal layer 580 which extends down into vias 585.

Second metal layer 580 may itself contain trenches 595 to form a pattern. Placement of second conductive layer trenches 595 as well as the dimensions is determined based on the circuit pattern for the given electrically conductive layer and the design rules for the integrated circuit device being fabricated. Generally, the dimensions are about 0.5 to 1.5 microns in width. The thickness of second metal layer 580 also varies based on the integrated circuit requirements and is generally about 0.5 to 2 microns.

Second conductive layer trenches 595 may be filled with trench insulating material 540, again preferably organic polymer. Dummy structure 597 surrounded by neighboring trenches 598, 599 similar to the dummy structure 535 and trenches 530 in layer 520 may also be implemented to avoid dishing and improve heat dissipation in layer 580. If further layers are still to be fabricated then the protective coating and planarization stopping layer and vias described above are repeated until the desired structure is achieved.

The process for fabricating the structure of the invention generally comprises generating a first patterned layer of an electrically conductive material, and filling the trenches within the pattern of the first patterned electrically conductive material with a first insulating material and planarizing the first insulating material. Then, a second, different insulating material is deposited over the first electrically conductive layer. If further structure is desired in the integrated circuit, then vias are created within the second insulating material, and a second electrically conductive layer is deposited on the second insulating material. Then, the second electrically conductive layer is patterned, and the trenches in the pattern are filled with the first insulating material, and the process is further repeated as necessary to complete the desired structure.

A detailed description of the techniques used in forming the described structure are given in a related co-pending application by Chiang et al. entitled "A Novel Interconnect Structure Using a Hard Mask for Low Dielectric Constant Materials", U.S. Ser. No. 670,624 assigned to the present assignee and filed on Jun. 26, 1996, which is hereby incorporated by reference.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method of forming an integrated circuit structure comprising:
    depositing a substrate of silicon dioxide;
    providing a first layer of electrically conductive material on said silicon dioxide;
    providing a second layer of electrically conductive material;
    depositing a masking layer on said first layer, said masking layer including a pattern which includes masking for interconnects and masking for dummy structures;
    arranging the dummy structures to provide mechanical properties to an organic polymer insulating material having a dielectric constant below that of silicon oxide, wherein the mechanical properties comprises one or more of hardness, mechanical strength, thermal expansion, and mechanical expansion;
    etching trenches between the dummy structures and interconnects within the first layer of electrically conductive material;
    filling the trenches with the insulating material;
    forming a separating layer between the first layer and the second layer of the electrically conductive material with the insulating material.

2. The method of claim 1, wherein said arranging the dummy structures to provide mechanical properties to an organic polymer insulating material comprises positioning the dummy structures approximately parallel of the interconnects.

3. The method of claim 1, wherein said arranging the dummy structures to provide mechanical properties to an organic polymer insulating material comprises substantially surrounding the interconnects with the dummy structures.

4. The method of claim 1, further comprising substantially surrounding the dummy structures with the insulating material.

5. The method of claim 1, wherein said depositing a substrate of silicon dioxide comprises depositing a substrate of phosphorous doped silicon dioxide.

6. The method of claim 1, wherein said depositing a masking layer on the first layer comprises depositing a masking layer that includes a pattern for masking which includes masking for dummy structures rectangular in shape.

* * * * *